(12) United States Patent
Perner

(10) Patent No.: US 8,942,026 B2
(45) Date of Patent: Jan. 27, 2015

(54) CIRCUIT AND METHOD FOR READING A RESISTIVE SWITCHING DEVICE IN AN ARRAY

(75) Inventor: Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/883,510

(22) PCT Filed: Feb. 28, 2011

(86) PCT No.: PCT/US2011/026496
§ 371 (c)(1),
(2), (4) Date: May 3, 2013

(87) PCT Pub. No.: WO2012/067667
PCT Pub. Date: May 24, 2012

(65) Prior Publication Data
US 2013/0223132 A1    Aug. 29, 2013

Related U.S. Application Data

(60) Provisional application No. 61/415,526, filed on Nov. 19, 2010.

(51) Int. Cl.
*G11C 11/00* (2006.01)
*G11C 13/00* (2006.01)
G11C 27/02 (2006.01)
(52) U.S. Cl.
CPC .......... *G11C 13/004* (2013.01); *G11C 13/0007* (2013.01); *G11C 27/02* (2013.01); *G11C 2013/0054* (2013.01)
USPC .................. 365/148; 365/189.09; 365/189.15

(58) Field of Classification Search
CPC .................. G11C 13/0007; G11C 2013/0054; G11C 27/02; G11C 13/004
USPC .......... 365/148, 158, 189.05, 189.07, 189.09, 365/189.15
See application file for complete search history.

(56) References Cited

U.S. PATENT DOCUMENTS

| 4,763,026 A * | 8/1988 | Tsen et al. ...................... 327/56 |
| 4,949,306 A * | 8/1990 | Nakagome et al. ...... 365/189.15 |
| 6,259,644 B1 * | 7/2001 | Tran et al. ..................... 365/209 |
| 6,819,612 B1 | 11/2004 | Achter |
| 6,954,392 B2 | 10/2005 | Baker |

(Continued)

OTHER PUBLICATIONS

PCT Search Report and Written Opinion, Nov. 1, 2011, Application No. PCT/US2011/026496.

(Continued)

*Primary Examiner* — Gene Auduong
(74) *Attorney, Agent, or Firm* — Hewlett-Packard Patent Department

(57) ABSTRACT

A read circuit for sensing a resistive state of a resistive switching device in a crosspoint array has an equipotential preamplifier connected to a selected column line of the resistive switching device in the array to deliver a read current while maintaining the selected column line at a reference voltage near a biasing voltage applied to unselected row lines of the array. The read circuit includes a reference voltage generation component for generating the reference voltage for the equipotential preamplifier. The reference voltage generation component samples the biasing voltage via the selected column line and adds a small increment to a sampled biasing voltage to form the reference voltage.

20 Claims, 6 Drawing Sheets

(56) References Cited

U.S. PATENT DOCUMENTS

| | | | |
|---|---|---|---|
| 7,453,751 B2 | 11/2008 | Forbes et al. | |
| 7,729,189 B2 | 6/2010 | Forbes | |
| 7,830,701 B2 | 11/2010 | Siau et al. | |
| 2001/0012228 A1* | 8/2001 | Perner | 365/210 |
| 2003/0206473 A1* | 11/2003 | Tran | 365/207 |
| 2003/0218905 A1* | 11/2003 | Perner et al. | 365/173 |
| 2004/0066678 A1* | 4/2004 | Oh et al. | 365/200 |
| 2004/0090809 A1* | 5/2004 | Tran | 365/100 |
| 2005/0195647 A1 | 9/2005 | Perner | |
| 2005/0254294 A1 | 11/2005 | Iwata | |
| 2007/0070753 A1* | 3/2007 | Tran | 365/207 |
| 2008/0159046 A1* | 7/2008 | Rinerson et al. | 365/226 |
| 2009/0225594 A1 | 9/2009 | Choi et al. | |
| 2010/0142254 A1 | 6/2010 | Choi et al. | |
| 2011/0292713 A1* | 12/2011 | Perner | 365/148 |

OTHER PUBLICATIONS

Supplementary European Search Report, Nov. 21, 2014, European Patent Application No. 11840766.7, 3 pages.

* cited by examiner

CIRCUIT AND METHOD FOR READING A RESISTIVE SWITCHING DEVICE IN AN ARRAY

RELATED APPLICATION

This application claims the priority of U.S. Provisional Application 61/415,526 filed on Nov. 19, 2010.

BACKGROUND

Memristive devices, or memristors, are a new type of switching devices with an electrically switchable device resistance. Memristive devices are both scientifically and technically interesting, and hold promise for non-volatile memory (NVM) and other fields. As today's flash memory technology is reaching its scaling limit, there is an urgent need for new memory technologies that can meet the storage capacity and speed demanded by future applications, and memories using resistive switching devices, such as memristors, are a promising candidate for meeting that need. For NVM applications, many nanoscale resistive switching devices can be formed in a two-dimensional array, such as a crossbar structure, to provide a very high storage capacity. Nevertheless, it has been a major challenge to reliably read the resistive state of a selected resistive switching device in an array, due that existence of other switching devices in the array that may form paths for leakage current, which can significantly reduce the signal/noise ratio of the read operation.

DETAILED DESCRIPTION

The following description provides a circuit for reading the resistive state of a resistive switching device in an array of switching devices, and a corresponding method for performing the read operation. The resistive state of switching device may represent a digital value. For instance, a high resistance of the device may indicate that the device is in an "OFF" state, which may represent a digital "0," while a low resistance may indicate that the device is in an "ON" state, which may represent a digital "1."

In some embodiments, the resistive switching device may be a bipolar memristive device. As used herein, a memristive device is a switching device with its resistance representing its switching state, and the resistance depends on the history of the voltage and current applied to the device. The term "bipolar" means that the device can be switched from a low-resistance state ("LRS") to a high-resistance state ("HRS") by applying a switching voltage of one polarity, and from a high-resistance state to a low-resistance state by applying a switching voltage of the opposite polarity.

Figure 1:
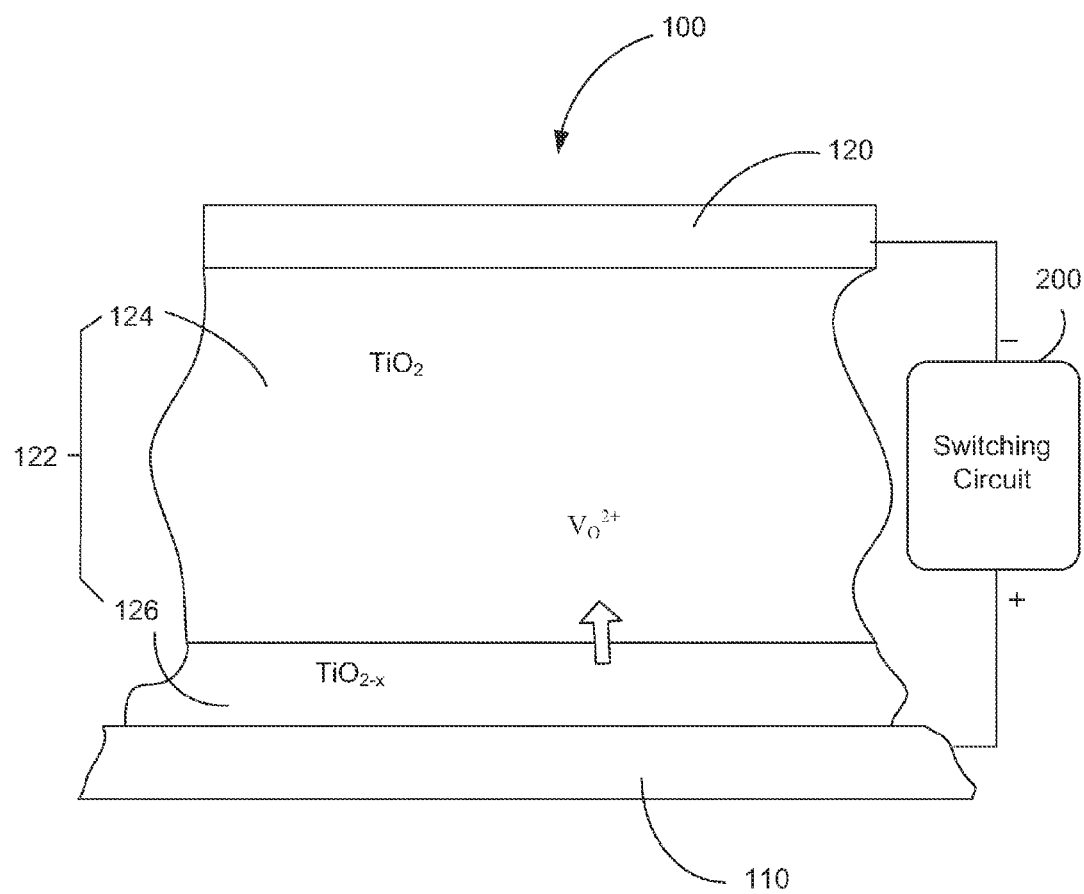
FIG. 1 is a schematic cross-sectional view of an example of a memristive device as one type of resistive switching device.
Figure 2:
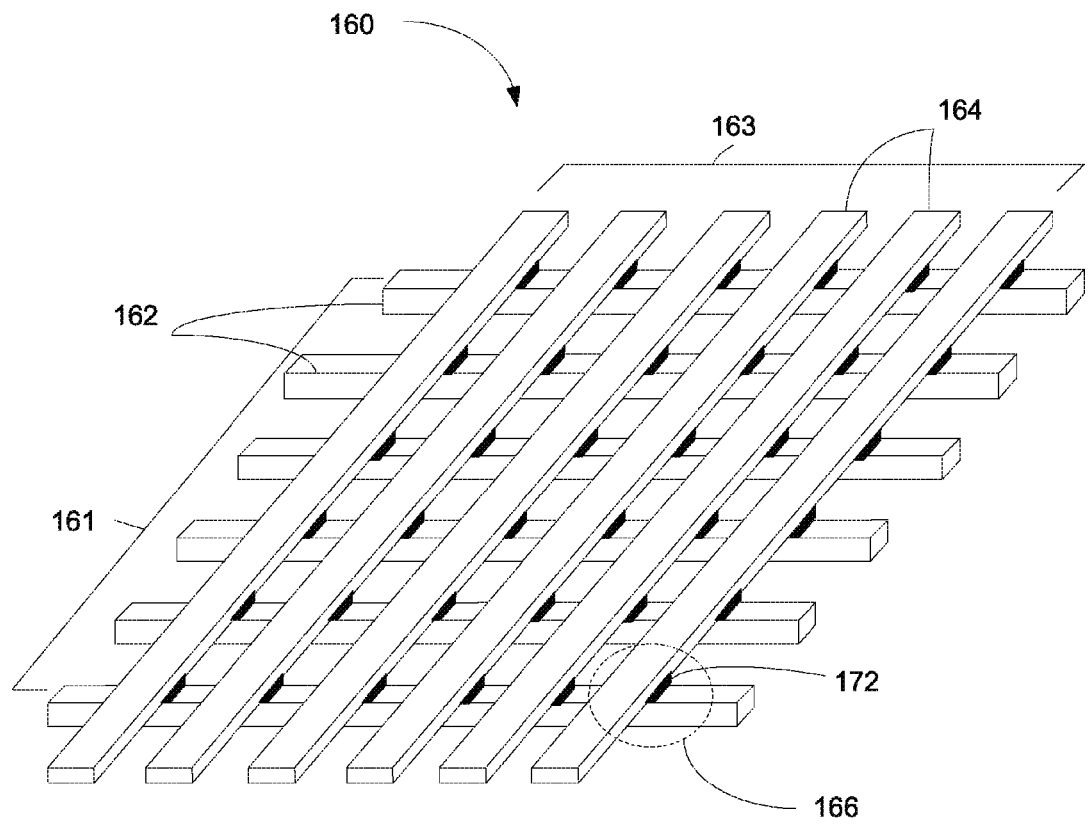
FIG. 2 is a schematic view of a crossbar structure containing multiple resistive switching devices.

FIG. 1 shows, in a schematic form, an example of a bipolar memristive device 100. In the embodiment shown in FIG. 1, the memristive device is a two-terminal device, with a top electrode 120 and a bottom electrode 110. An active region 122, where the switching behavior takes place, is disposed between the two electrodes. The active region 122 of the switching device 100 includes a switching material that may be electronically semiconducting or nominally insulating, as well as a weak ionic conductor. The switching material contains dopants that may be driven under a sufficiently strong electric field to drift through the switching material, resulting in changes in the resistance of the memristive device. The memristive device 100 can be used, for example, as a non-volatile memory cell, for storing digital information. Such a memory cell may be incorporated into a crossbar structure to provide a high storage capacity, as illustrated in FIG. 2.

Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The listing of possible switching materials is not exhaustive and do not restrict the scope of the present invention. The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

The nanoscale switching device 100 can be switched between ON and OFF states by controlling the concentration and distribution of the oxygen vacancies in the switching material in the active region 122. When a DC switching voltage is applied across the top and bottom electrodes 120 and 110, an electric field is created across the active region 122. The switching voltage and current may be supplied by a switching circuit 200. The electric field across the active region 122, if of a sufficient strength and proper polarity, may drive the oxygen vacancies to drift through the switching material towards the top electrode 120, thereby turning the device into an ON state.

By way of example, as shown in FIG. 1, in one embodiment the switching material may be $TiO_2$. In this case, the dopants that may be carried by and transported through the switching material are oxygen vacancies ($V_O^{2+}$). The active region 122 of the switching device has two sub-regions or layers: a primary region 124 and a secondary region 126. The primary region 124 is the main place where the switching behavior occurs. In the originally formed state of the device, the primary region 124 has a relatively low dopant concentration, while the secondary region 126 has a relatively high dopant level. The secondary region 126 functions as a dopant source/drain. During a switching operation, dopants may be driven from the secondary region 126 into the primary region 124, or from the primary region to the secondary region, to change the distribution of dopants in the primary region, thereby changing the conductivity across the primary region.

If the polarity of the electric field is reversed, the dopants may drift in an opposite direction across the switching material and away from the top electrode 120, thereby turning the device into an OFF state. In this way, the switching is reversible and may be repeated. Due to the relatively large electric field needed to cause dopant drifting, after the switching voltage is removed, the locations of the dopants remain stable in the switching material. The switching is bipolar in that voltages of opposite polarities are used to switch the device on and off. The state of the switching device 100 may be read by applying a read voltage to the bottom and top electrodes 110 and 120 to sense the resistance across these two electrodes. The read voltage is typically much lower than the threshold voltage required to induce drifting of the ionic dopants between the top and bottom electrodes, so that the read operation does not alter the resistance state of the switching device.

Memristive switching devices may be formed into an array for various applications that benefit from having a high density of switching devices. FIG. 2 shows an example of a two-dimensional array 160 of memristive switching devices. The array 160 has a first group 161 of generally parallel nanowires 162 running in a first direction, and a second group 163 of generally parallel nanowires 164 running in a second direction at an angle, such as 90 degrees, from the first direction. One group of the nanowires may be labeled as the row lines, and the other group may be labeled as the column lines. The two layers of nanowires 162 and 164 form a two-dimensional lattice which is commonly referred to as a crossbar structure, with each nanowire 162 in the first layer intersecting a plurality of the nanowires 164 of the second layer, and vice versa. A memristive switching device 166 may be formed at each intersection of the nanowires 162 and 164. The switching device 166 has a nanowire of the second group 163 as its top electrode and a nanowire of the first group 161 as the bottom electrode, and an active region 172 containing a switching material between the two nanowires. Each memristive device 166 in the two-dimensional array can be uniquely addressed by selecting the row line and column line that form the electrodes of the memristive device.

As mentioned above, one challenge that results from the use of a crossbar memory structure is that it can be difficult to reliably read the resistive state of a selected device in the array. To sense the resistive state of the selected device, a sensing voltage may be applied to the device via the row line and column line of the device, and the current flowing through the selected device may be monitored to determine the resistance of the device. There are, however, other switching devices connected to the selected row line or the selected column line. Those devices, referred to as "half-selected" devices, can form paths for leakage current, and it can be difficult to isolate the current flowing through the selected device from the leakage current, which can be rather large if there are many devices on each row line or column line.

Figure 3:
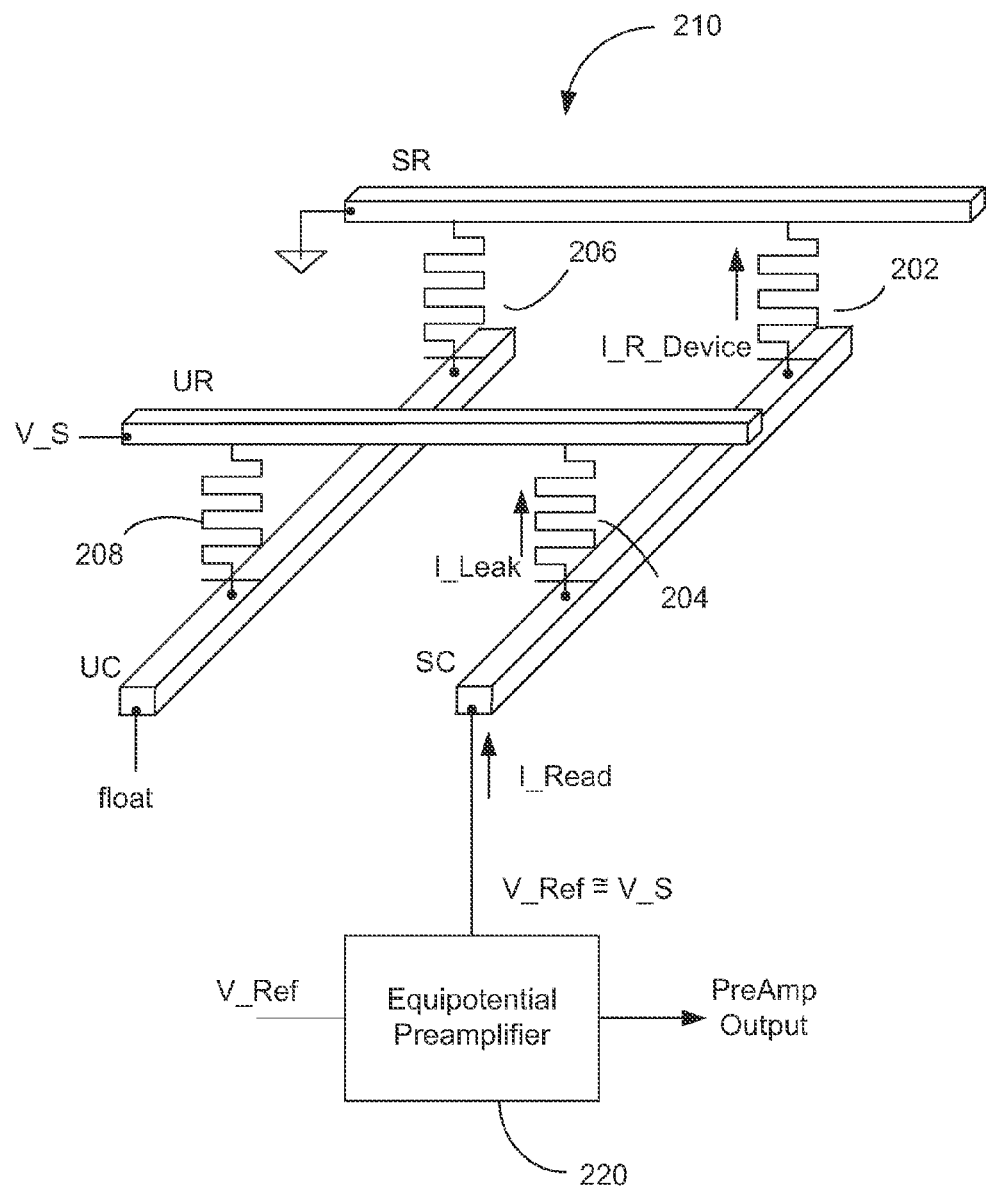
FIG. 3 is a schematic diagram representing an abstraction of a crossbar of resistive switching devices.

To better understand the issue of leakage current in a crossbar that can complicate the operation of reading a selected resistive switching device (the "target device"), FIG. 3 shows an abstraction of a crossbar 210 in a simplified form. The target device 202 (shown in electronic circuit symbol of a memristor) to be read is at the intersection of a selected row line SR and a selected column line SC. The unselected row UR in FIG. 3 represents all rows in the crossbar 210 other than the selected row SR, and the unselected column line UC represents all columns of the crossbar 210 other than the selected column line. The device 204 represents all other resistive switching devices connected in parallel to the selected column line SC, and the device 206 represents all other resistive switching devices connected in parallel to the selected row line SR. The device 208 represents all resistive switching devices in the crossbar 210 that are not connected to either the selected column or the selected row. When a read voltage is applied across the selected column SC and the selected row SR, the devices 204 and 206 become half-selected. If there is a voltage difference between the selected row or column line and the unselected lines, the half-selected devices will pass leakage currents due to their finite resistance values. Such leakage currents are a form of noise for the read operation. If there are many switching devices connected to each row or column line in the crossbar, the magnitude of the leakage current can become rather large, and can swamp the real signal of the read operation, which is the current passing through the target device under the read voltage.

An effective solution to the leakage current problem is to bias all the unselected row lines in the crossbar to substantially the same voltage that is applied to the selected column line during the read operation. As illustrated in FIG. 3, when the unselected row line UR is biased to substantially the same voltage as the selected column line, the leakage current passing through the half-selected device 204 will be zero or very small. Thus, the sensing current flowing through the selected column SC can have a very small noise component and be mostly the read current flowing through the target device 202. This approach, termed "equipotential sensing," provides an effective way to achieve a reasonably high signal/noise ratio for the read operation. To maintain the selected column line at substantially the same voltage of the unselected row lines, an equipotential preamplifier 220 may be used. The equipotential preamplifier 220 is connected to the selected column SC, and has a reference voltage input. For the read operation, the reference voltage V_Ref is set to be substantially the same as sense voltage VS to which the unselected row lines are biased. The equipotential preamplifier holds the selected column line to the reference voltage V_Ref while allowing the read current I_Read to flow to the crossbar 210 through the selected column line SC.

The effectiveness of the equipotential sensing technique depends on the proper setting of the reference voltage for the equipotential preamplifier. The reference voltage V_Ref is set not only to be close to the biasing voltage V_S on the unselected row lines so as to reduce the leakage current, but also to enable the equipotential preamplifier to operate in a linear range. Simply using the same biasing voltage on the unselected rows as the reference voltage for the equipotential preamplifier is not guaranteed to work.

In the embodiments described below, this issue of providing a proper reference voltage is solved by adaptively setting the reference voltage V_Ref based on the bias voltage applied to unselected row lines. To that end, a sample-and-hold circuit may be used to sample the bias voltage on the unselected rows. A small increment may then be added to the sampled voltage to form the reference voltage.

Figure 4:
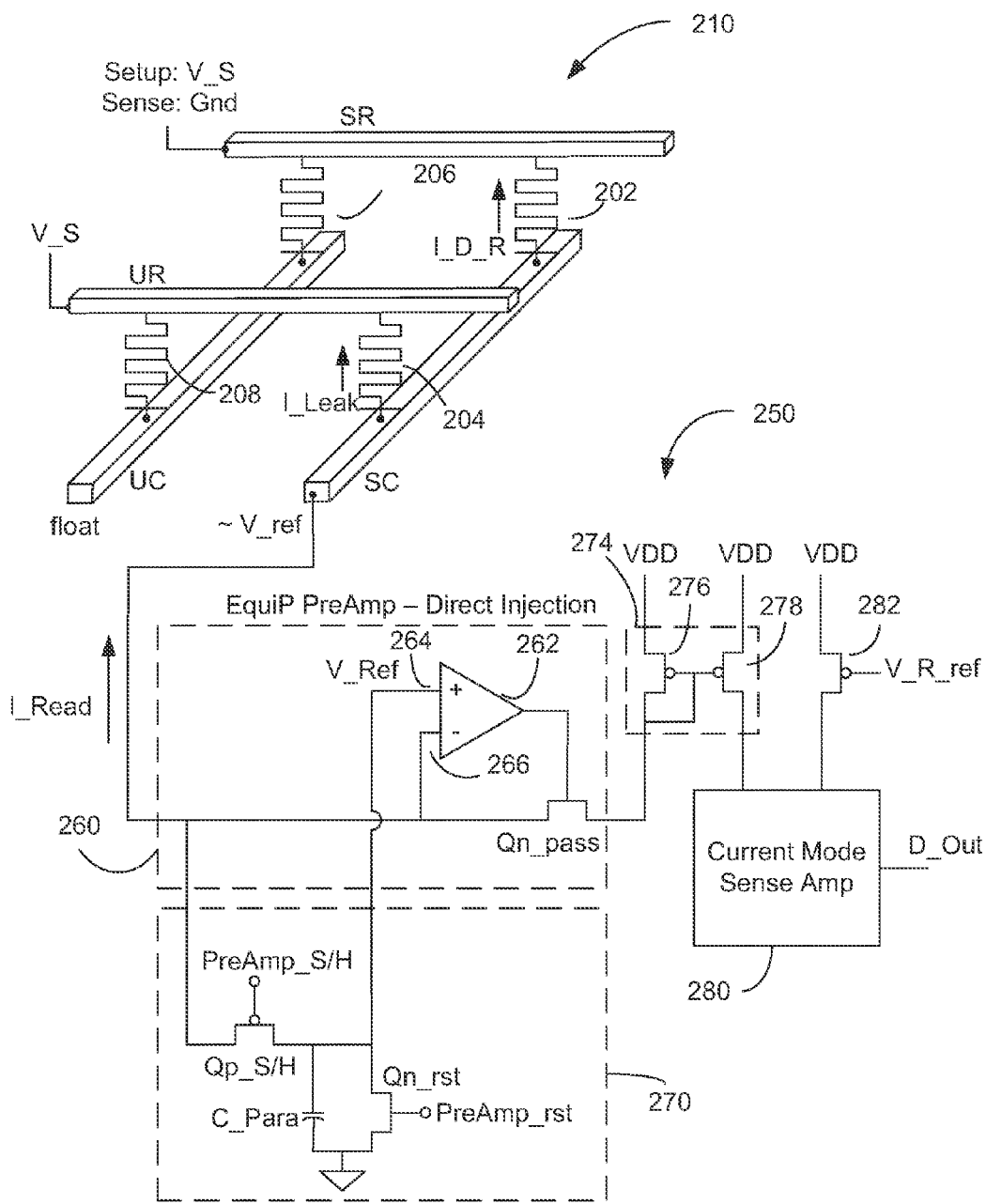
FIG. 4 is a schematic diagram of an electronic circuit for reading a selected resistive switching device in a crossbar using an "equipotential sensing" approach.

FIG. 4 shows an embodiment of a read circuit 250 that includes an equipotential preamplifier 260 with a reference voltage setting component 270. In this embodiment, the equipotential preamplifier 260 has a buffered direct injection circuit which contains an operational amplifier 262 and a pass transistor Qn_pass. The positive input 264 of the operational amplifier 262 is where the reference voltage V_Ref goes. The output of the operational amplifier 262 is connected to the gate of the pass transistor Qn_pass, while the negative input 266 of the operational amplifier 262 is connected to the drain side of the pass transistor Qn_pass and to the selected column SC of the array 210. The reference voltage setting component 270 includes a sample-and-hold transistor Qp_S/H and a reset transistor Qn_rst for resetting the equipotential preamplifier.

Also shown in FIG. 4 is the parasitic capacitance C_Para between the source of the sample-and-hold transistor Qp_S/H and the ground.

The read circuit further includes a current mode sense amplifier 280 to measure the read current passed through the selected column during a read operation. To that end, the read circuit includes a current mirror 274, which includes a master transistor 276 and a slave transistor 278. The sense current I_Read for reading the target device 202 is sourced by the master transistor 276 of the current mirror 274. Due to the mirroring effect, the same amount of current is sourced by the slave transistor 278. That current is one input of the current-mode sensing amplifier 270. The other input of the current-mode sensing amplifier is a reference current generated by a transistor 282 under the control of a current-read reference voltage V_R_ref.

Figure 5:
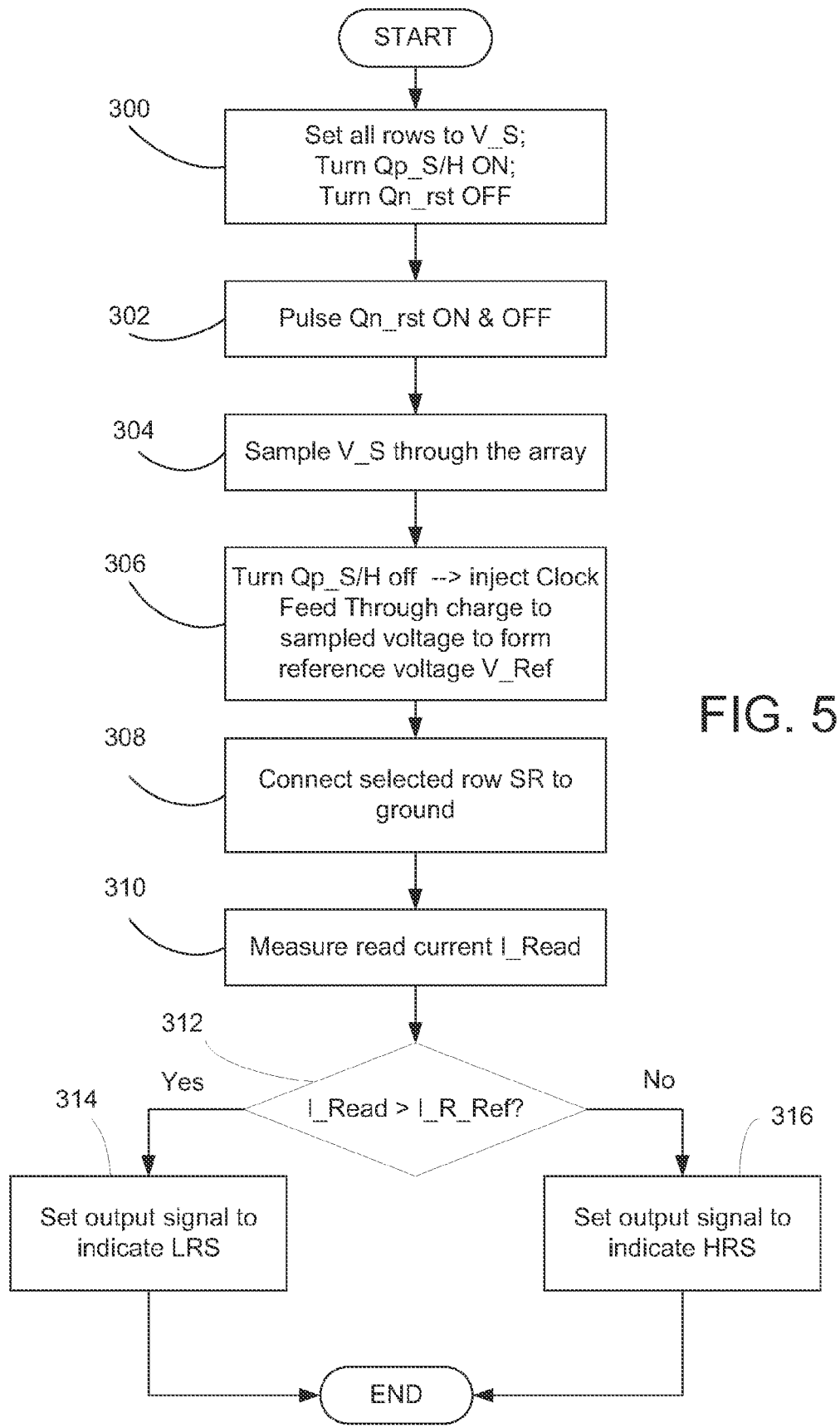
FIG. 5 is a flowchart showing a process of reading a selected resistive switching device in a crossbar using the circuit of FIG. 4.

The process of reading the target device in the crossbar 210 using the read circuit 250 is now described with reference to the flowchart in FIG. 5. First, the circuit is set up for the operation of generating the reference voltage V_Ref for the equipotential preamplifier 260. For that purpose, all the rows of the crossbar, including the selected row SR of the target device 202, are set to the equipotential biasing voltage V_S. The sample-and-hold transistor Qp_S/H is turned ON to a low impedance state, and the reset transistor Qn_rst is turned OFF to a high impedance state (step 300). With the sample-and-hold transistor Qp_S/H turned ON, the positive and negative inputs 264, 266 of the equipotential preamplifier 260 are connected together. Also, since the negative input 266 of the preamplifier is already connected to the selected column SC of the target device, both the positive and negative inputs are now connected to the selected column.

The equipotential preamplifier 260 is then reset by pulsing the reset transistor Qn_rst ON and OFF (step 302). When the reset transistor Qn_rst is ON, both the positive and negative inputs of the operational amplifier 262 are brought to a voltage level that is close to ground, thereby resetting the preamplifier. Once the reset transistor Qn_rst is turned OFF, the inputs of operational amplifier 262 become floating. Because they are connected to crossbar 210 via the selected column SC, there is a voltage difference between the row lines and the inputs 264, 266, a current will flow through the target device 202 and also other leakage paths and via the selected column to charge up the parasitic capacitance C_Para between the sample-and-hold transistor Qp_S/H and the ground. A sufficient amount time is given to allow the parasitic capacitance to be charged so that the inputs 264 and 266 of the operational amplifier 262 are brought to a level close to the biasing voltage V_S on the row lines (step 304).

Thereafter, the sample-and-hold transistor Qp_S/H is turned OFF (step 306). It is to be noted that turning off the sample-and-hold transistor does more than holding the voltage just sampled as described above. To turn the transistor Qp_S/H off, the gate of the transistor is switched to an OFF voltage. Due to the "clock feed through" effect, this switching of the gate voltage causes further charge to be injected into the parasitic capacitance C_Para, changing the voltage across the capacitance by a small amount. In this embodiment, the sample-and-hold transistor Qp_S/H is a p-channel MOSFET, and a positive voltage change on its control gate will cause a positive clock feed through charge to be added to the parasitic capacitance C_Para, resulting in a small increase in the voltage across the capacitance. This voltage now becomes the reference voltage V_Ref of the equipotential preamplifier 260. Thus, the reference voltage V_Ref is slightly higher than the biasing voltage V_S applied to the row lines. Even thought the voltage increase caused by the clock feed through effect is relatively small, on the order of tens of millivolts or less, its effect is significant. Without the extra voltage difference, the input voltages of the preamplifier as built up in the sampling phase would place the preamplifier in a cut-off mode. With the small increase of the reference voltage caused by clock feed through, the operational amplifier 262 is now put in a linear operation mode and will cause a small amount of noise (half select) current to flow. As a result, the output of the operational amplifier 262 is turned to an ON state, such that the pass transistor Qn_pass is turned ON. At this point, the equipotential preamplifier 260 is ready for the read operation.

To start the read operation, the selected row line SR of the target device 202 is connected to ground (step 308), while the unselected row lines UR are still connected to the biasing voltage V_S. Because the selected column SC is maintained at the reference voltage V_Ref by the equipotential preamplifier 260, a device read current I_D_R flows through the target device 202 to the grounded selected row SR. In the meantime, a small leakage current I_Leak may flow through the half-selected devices 204 connected to the selected column SC. The total read current I_Read flowing into the crossbar 210 through the selected column SC is the sum of the device read current I_D_R and the leakage current I_Leak. Nevertheless, due to the small difference between the reference voltage V_Ref and the biasing voltage V_S, the leakage current I_Leak is relatively small. In other words, the noise component in the read current is controlled to be manageably small compared to the real signal (the device read current). A reasonable signal/noise ratio may be, for instance, 10:1.

The read current I Read delivered by the equipotential preamplifier 260 may be measured to determine the resistive state of the target device 202 (step 310). In the embodiment of FIG. 4, the read current is duplicated by the slave transistor 278 of the current mirror 274, and the duplicated current is fed to the current mode sense amplifier 280 as one input. The sense amplifier 280 compares the duplicated read current to a reference current I_R_ref (step 312) and generates an output signal based on the comparison. If the read current is lower than the reference current, the output signal D_Out is set to indicate that the target device is in a high-resistance (or OFF) state (step 314). If the read current is higher than the reference current, the output signal D_Out is set to indicate that the target device is in a low-resistance (or ON) state (step 316). In this regard, the magnitude of the reference current I_R_ref may be selected based on the expected resistance values of the ON and OFF states of the switching devices, taking into account the magnitude of the expected noise level in the read current.

Figure 6:
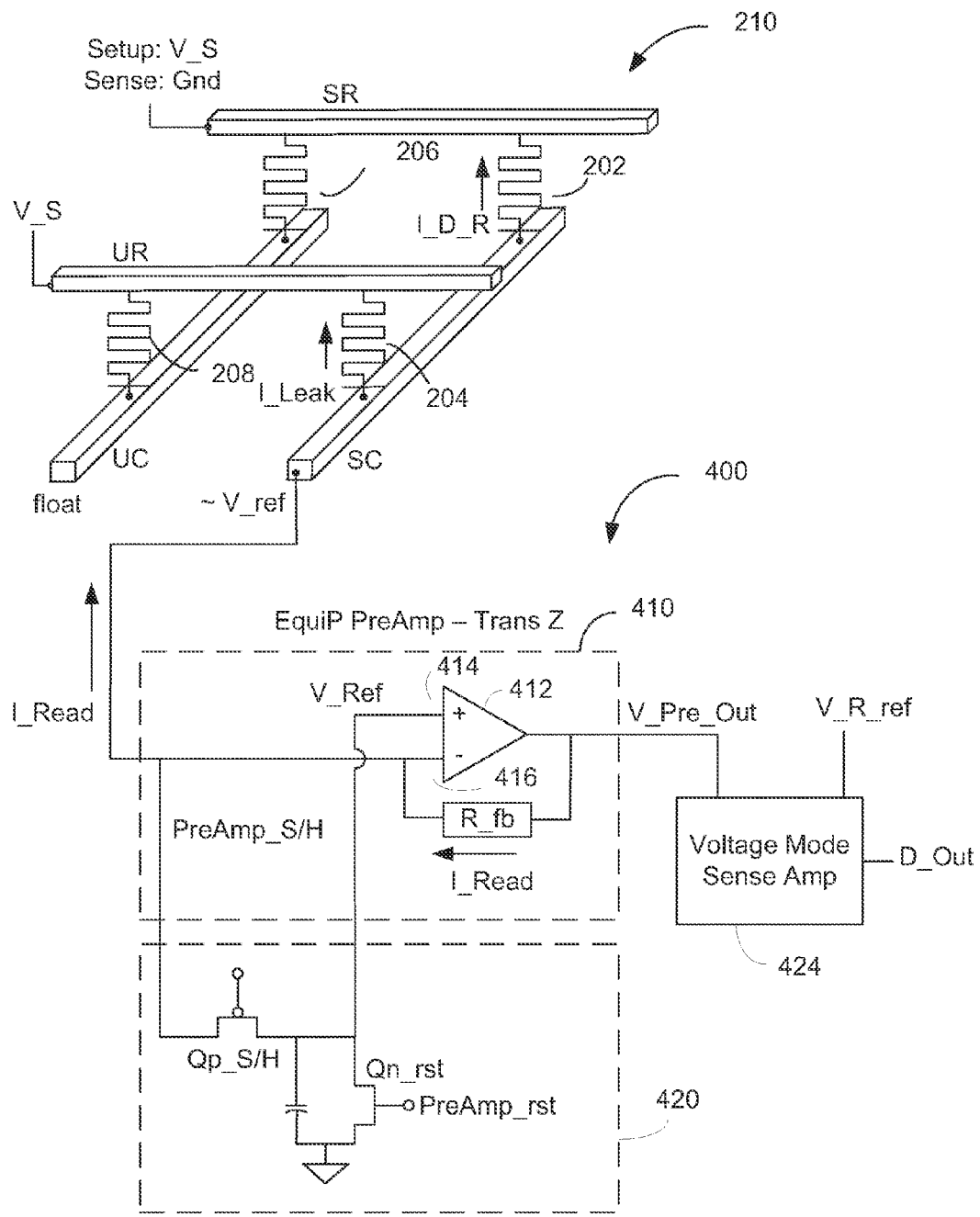
FIG. 6 is a schematic diagram of another embodiment of an electronic circuit for reading a selected resistive switching device in a crossbar using the "equipotential sensing" approach.

FIG. 6 shows a read circuit 400 in accordance with another embodiment. In this embodiment, the equipotential preamplifier 410 is a transimpedance amplifier, in contrast to the buffered direct-current-injection amplifier in the embodiment of FIG. 4. The equipotential preamplifier 410 includes an operational amplifier 412. The negative input 416 of the operational amplifier is connected to the selected column SC of the target device 202 in the array 210. A feedback resistor R_fb connects the negative input 416 to the output of the operational amplifier 412. A reference voltage V_Ref is applied to positive input 414 of the operational amplifier. To generate the reference voltage V_Ref, the read circuit includes a reference voltage generation component 420, which includes a sample-and-hold transistor Qp_S/H and a reset transistor Qn_rst. The two transistors are operated in the same manner as described earlier in connection with FIG. 5 to set the reference voltage V_Ref.

To read the target device 202, the selected raw line SR is connected to ground. The read current I_Read_flows through the feedback resistor R_fb to the selected column SC. The read current I_Read includes the device read current I_D_R and the leakage current I_Leak. The output of the equipotential preamplifier 410 is a voltage signal V_Pre_Out, which equals V_Ref+(I_Read*R_fb). This voltage is an input to a voltage mode sensing amplifier 424, which has a state reference voltage V_R_ref as its second input. The sensing amplifier 424 compares the voltage V_Pre_Out to the state reference voltage V_R_ref, and generates an output signal D_Out based on the comparison. If the voltage V_Pre_Out is higher than the state reference voltage V_R_ref, it is an indication of a high read current, and thus a low-resistance stat of the target device. On the other hand, a V_Pre_Out lower than V_R_ref is an indication of a low read current and a high-resistance state of the target device.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A read circuit for sensing a resistive state of a resistive switching device in a crosspoint array, comprising:
    an equipotential preamplifier for connecting to a selected column line of the resistive switching device in the array to deliver a read current while maintaining the selected column line at a reference voltage matched to a biasing voltage applied to unselected row lines of the array; and
    a reference voltage generation component for generating the reference voltage for the equipotential preamplifier, the reference voltage generation component being connected to sample the biasing voltage via the selected column line and add to a sampled biasing voltage to form the reference voltage.

2. A read circuit as in claim 1, wherein the reference voltage generation component includes a sample-and-hold transistor connected to a reference input of the equipotential amplifier to connect the reference input to the selected column line during sampling of the biasing voltage.

3. A read circuit as in claim 2, wherein the sample-and-hold transistor adds an increment to the sampled biasing voltage via a clock feed through charge.

4. A read circuit as in claim 3, wherein the equipotential preamplifier includes a direct injection amplifier.

5. A read circuit as in claim 4, further including a current-mode sense amplifier for measuring the read current.

6. A read circuit as in claim 5, wherein the current-mode sense amplifier compares the read current to a reference current and generates an output signal indicative of the resistive state of the resistive switching device.

7. A read circuit as in claim 3, wherein the equipotential preamplifier is a transimpedance amplifier for generating a voltage output signal according to the read current.

8. A read circuit as in claim 7, further including a voltage-mode sense amplifier for comparing the voltage output signal of the equipotential preamplifier with a state reference voltage and generating an output signal indicative of the resistive state of the resistive switching device.

9. A method of reading a resistive state of a resistive switching device in a crosspoint array, comprising:
    connecting an equipotential preamplifier to a selected column line of the resistive switching device in the array;
    applying a biasing voltage to unselected row lines of the array;
    sampling the biasing voltage via the selected column line;
    adding to a sampled biasing voltage to generate a reference voltage;
    operating the equipotential preamplifier to deliver a read current through the selected column line while maintaining the selected column line at the reference voltage; and
    determining the resistive state of the resistive switching device based on the read current.

10. A method as in claim 9, wherein the step of sampling uses a sample-and-hold transistor to selectively connect a reference input of the equipotential amplifier to the selected column line.

11. A method as in claim 10, wherein storing the sampled reference voltage adds to the sampled biasing voltage to produce the reference voltage via a clock feed through charge through the sample-and-hold transistor.

12. A method as in claim 11, wherein the step of determining includes measuring the read current.

13. A method as in claim 12, wherein the step of determining includes comparing the read current with a reference current and generating an output signal based on the comparison.

14. A method as in claim 11, wherein the step of determining includes sensing a voltage output of the equipotential preamplifier.

15. A method as in claim 14, wherein the step of determining includes comparing the voltage output of the equipotential preamplifier with a state reference voltage and generating an output signal based on the comparison.

16. A read circuit for sensing a resistive state of a resistive switching device in a crosspoint array, comprising:
    an equipotential preamplifier for connecting to a selected column line of the resistive switching device in the array to deliver a read current while the selected column line is maintained at a reference voltage that is matched to a biasing voltage applied to unselected row lines of the array during a reading operation; and
    a reference voltage circuit for adding voltage to a sampled value of the biasing voltage and outputting that voltage that is higher than the biasing voltage to the equipotential preamplifier as a reference voltage.

17. The read circuit of claim 16, wherein the reference voltage circuit comprises a sample and hold transistor connected to a reference input of the equipotential amplifier.

18. The read circuit of claim 17, wherein the sample-and-hold transistor adds to the sampled value of the biasing voltage via a clock feed through charge.

19. A read circuit as in claim 16, wherein an output of the equipotential preamplifier is applied to a gate of a pass transistor, with a drain of the pass transistor being connected to the selected column.

20. A read circuit as in claim 16, further comprising a feedback resistor connected between an output and a negative input of the equipotential preamplifier.

* * * * *

UNITED STATES PATENT AND TRADEMARK OFFICE
CERTIFICATE OF CORRECTION

PATENT NO.        : 8,942,026 B2                                              Page 1 of 1
APPLICATION NO.   : 13/883510
DATED             : January 27, 2015
INVENTOR(S)       : Frederick Perner It is certified that error appears in the above-identified patent and that said Letters Patent is hereby corrected as shown below:

In the Claims

In column 8, line 56, in Claim 19, delete "claim16" and insert -- claim 16 --, therefor.

Signed and Sealed this
Fourteenth Day of July, 2015

Michelle K. Lee
*Director of the United States Patent and Trademark Office*